ize: medium"># United States Patent [19]

Flax

[11] 4,453,550
[45] Jun. 12, 1984

[54] METHOD AND MEANS FOR DETECTING A PERIODIC WAVE STRUCTURE

[75] Inventor: Stephen W. Flax, Waukesha, Wis.

[73] Assignee: General Electric Company, Rancho Cordova, Calif.

[21] Appl. No.: 369,369

[22] Filed: Apr. 19, 1982

[51] Int. Cl.³ ............................................. A61B 10/00
[52] U.S. Cl. .................................................. 128/660
[58] Field of Search ............................ 128/660–663, 128/731, 702

[56] References Cited

PUBLICATIONS

Drost, C. J. et al., "Average Frequency Processor for UTS Doppler Systems," Proceedings of 7th New England Bioengr. Conf., Troy, N.Y., U.S.A., (Mar. 22–23, 1979), pp. 224–227.
Hartley, C. J. et al., "Synchronized Pulsed Doppler BF and UTS Dimension Measurement in Conscious Dog," UTS in Med. & Biol., vol. 4 #2, pp. 99–110, Pergamon Press 1978.
Forster, F. K. et al., "Numerical Method for Analyzing a New Time Domain Freq. Analyzer for UTS Doppler Signals," Conf: 1978, Advances in Bioengr., San Francisco, Cal., Dec. 10–15, 1978, pp. 113–115.
Brandestine, M. A. et al., "BF Imaging Using a Discrete Time-Frequency Meter", 1978 UTS Symp. Proceedings, Cherry Hill, N.J., (IEEE Cat. #78-CH 1344-1SU), Sep. 25–27, 1978, pp. 348–352.
Clynes, M. et al., "Biomed. Engineering Systems", pp. 629–630, McGraw-Hill, N.Y., N.Y., 1977.
Dascalov, I. K. et al., "EEG Pre-Processing by an On-Line Amplitude and Frequency Analyser", MBE May 1974, pp. 335–338.
Johnston, K. W. et al., "Doppler Methods for Quantitative Measurement and Localization of Peripheral Arterial Occlusive Disease by BV Waveform Analysis", Ultrasound in Medicine & Biology, vol. 4, #3, pp. 209–223 (1978).

Primary Examiner—Kyle L. Howell
Assistant Examiner—Francis J. Jaworski
Attorney, Agent, or Firm—Flehr, Hohbach, Test, Albritton & Herbert

[57] ABSTRACT

The periodicity of a wave structure is determined by detecting a temporal feature such as zero crossings of the wave, measuring time intervals between zero crossings, and developing a histogram of the time intervals. A periodic structure will exhibit a uniformity in the time intervals, whereas a random signal will have random time intervals between zero crossings.

4 Claims, 15 Drawing Figures

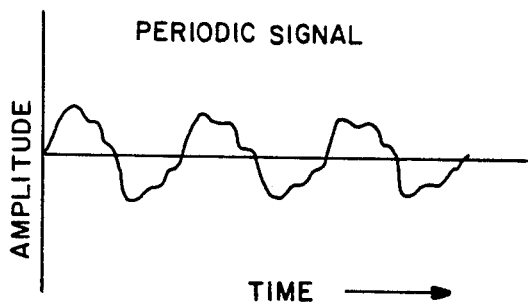
FIG.—1a
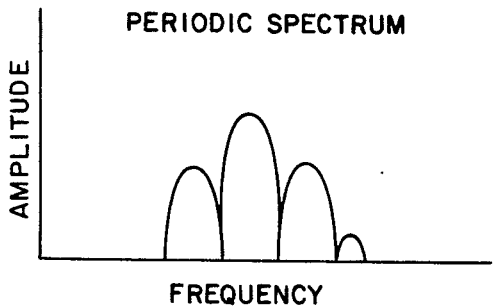
FIG.—1b
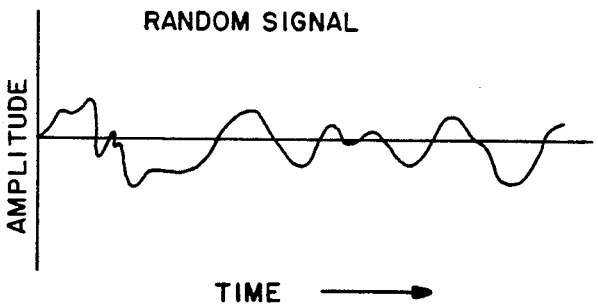
FIG.—2a
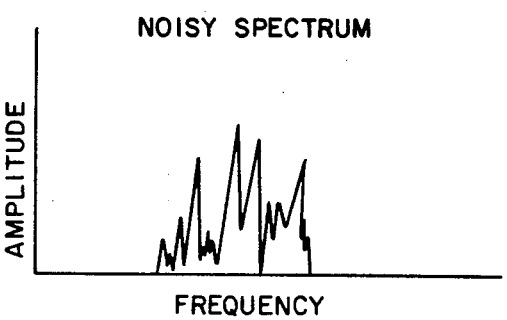
FIG.—2b

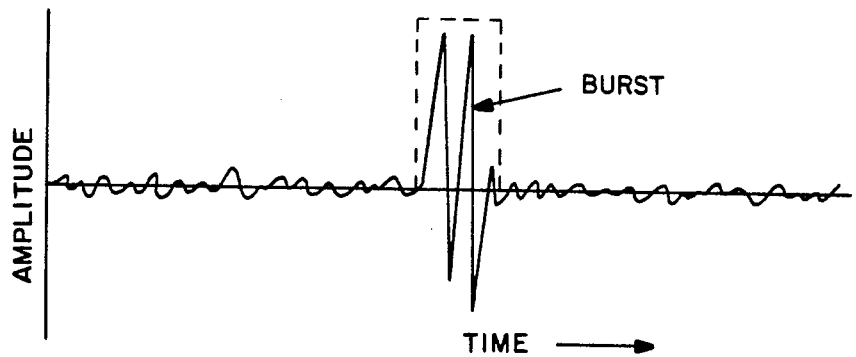
FIG.—3a
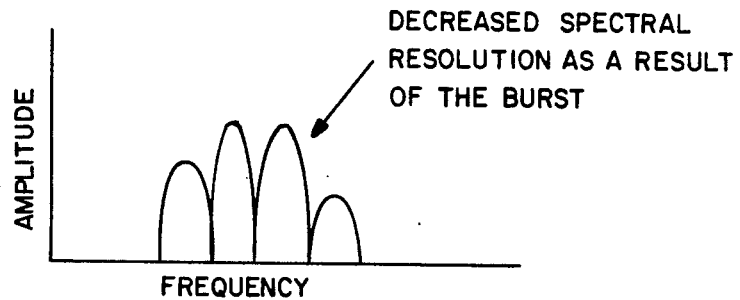
FIG.—3b
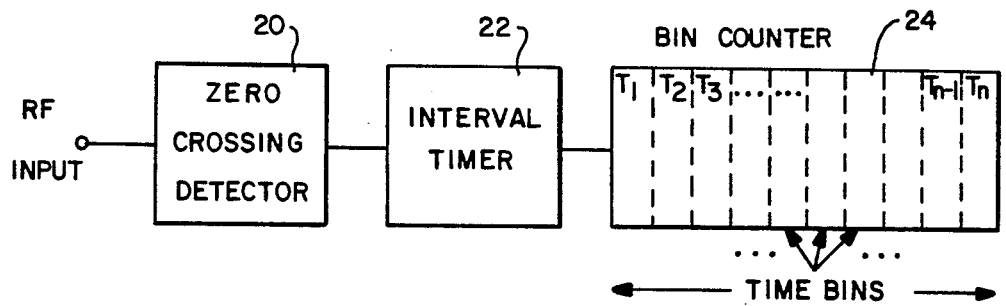
FIG.—8

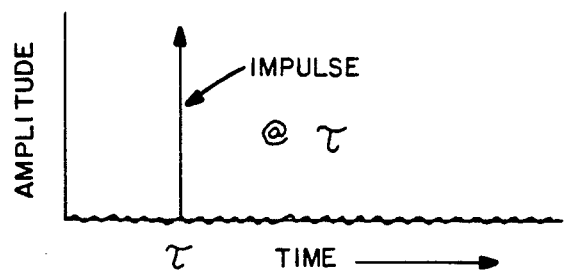
FIG.—4a
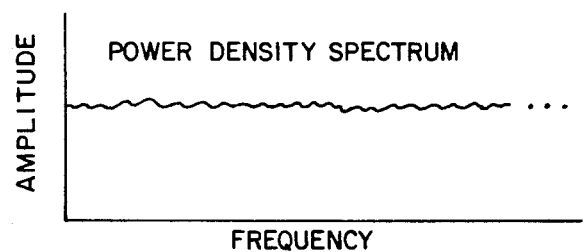
FIG.—4b
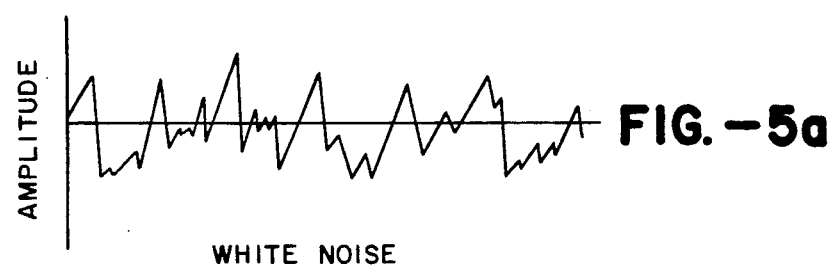
FIG.—5a
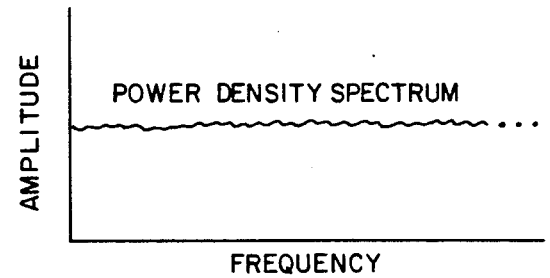
FIG.—5b

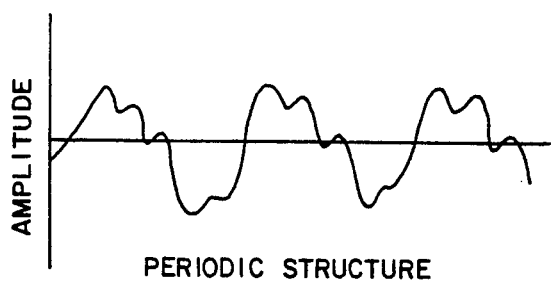
FIG.—6a
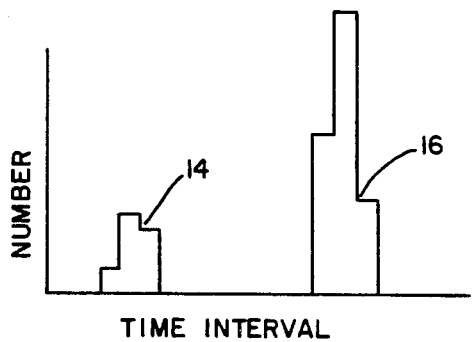
FIG.—6b
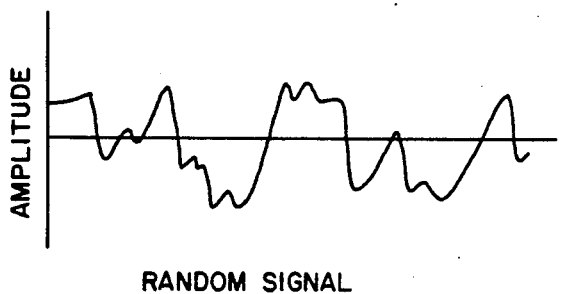
FIG.—7a
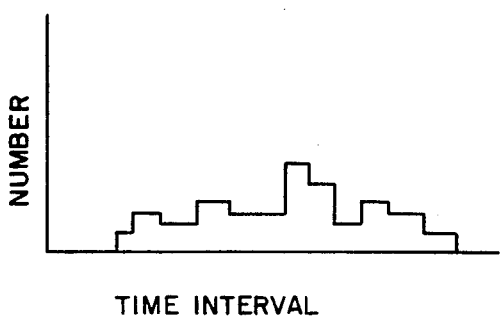
FIG.—7b

METHOD AND MEANS FOR DETECTING A PERIODIC WAVE STRUCTURE

This invention relates generally to ultrasonic diagnostic systems, and more particularly the invention relates to a method and means for ascertaining a periodic structure in an ultrasonic wave and like waves.

Biological tissue can be characterized by using ultrasound techniques to find periodic structure within the tissue. This is similar to X-ray defraction techniques for characterizing crystal structure in which predominant scattering bodies are spaced with some periodic separation whereby the resulting constructive and destructive interference patterns produced by a wave travelling through the lattice will produce a characteristic periodic pattern in a reflected wave. Using ultrasonic techniques with biological tissue the periodicity can be detected either in the time domain or in the frequency domain since any temporal periodicity will similarly exist as a periodic structure in the frequency domain. This duality between time and frequency is important since structure which is fine in either the space or time domain will be coarse in the frequency domain and vice versa. Thus, if a suspected structure cannot be directly observed in one domain because of the closeness of spacing or resolution, the structure can often be ascertained from the other domain.

Present work in the field of ultrasonic examination of biological tissue is directed to identifying a periodic structure or signature in the power density spectrum of a reflected ultrasonic wave. To this end autocorrelation techniques have been employed to identify any periodicity in the power spectrum, and in some cases a Cepstrum is taken to identify any periodicity. In either case the power density of the reflected signal is derived and all phase information therewith is lost. In certain situations short bursts of energy and energy patterns predominate in the analysis of the power spectrum yielding an apparent periodicity in the power density spectrum although no real periodic structure exists in the tissue. Thus, real structure present in the temporal signal will manifest itself as phase structure in the time domain as well as periodic amplitude structure in the power density spectrum. However, the converse is not necessarily true. Some periodicity in the power density spectrum is not a sufficient condition to guarantee phase coherence in the time domain. As an example, an impulse and random noise both have the same power density spectrum. However, the impulse has phase coherences while the random noise has a random phase pattern.

Accordingly, an object of the present invention is a method of determining a periodic wave structure by detecting phase coherence therein.

Another object of the invention is apparatus useful in detecting phase coherence in a complex wave.

Yet another object of the invention is an improved method of analyzing a reflected ultrasonic wave to determine characteristics of biological tissue.

A feature of the invention is the detection of zero crossing points of a reflected wave and measuring the time periods between consecutive zero crossings.

The invention and objects and features thereof will be more readily apparent from the following detailed description and appended claims when taken with the drawing, in which:

FIGS. 1A and 1B are plots of a periodic signal in time and frequency domains.

FIGS. 2A and 2B are plots of a random signal in time and frequency domains.

FIGS. 3A and 3B are plots of a random signal with a non-periodic burst signal burst in time and frequency domains.

FIGS. 4A and 4B are plots of a signal impulse and the power density spectrum thereof.

FIGS. 5A and 5B are plots of white noise and the power density spectrum thereof.

FIGS. 6A and 6B are plots of a periodic wave and of time intervals between zero crossings of the wave.

FIGS. 7A and 7B are plots of a random signal and the time intervals between zero crossings thereof.

FIG. 8 is a functional block diagram of apparatus useful in determining a periodic wave structure in accordance with the invention.

Referring now to the drawings, FIGS. 1A and 1B and FIGS. 2A and 2B illustrate the duality between time and frequency of periodic and random signals. FIG. 1A illustrates a complex but periodic signal and FIG. 1B illustrates the frequency spectrum thereof. From these plots it is seen that the temporal periodicity of FIG. 1A also exists as a periodic structure in the frequency domain of FIG. 1B. This duality between time and frequency shows that the structure of a wave may be difficult to ascertain in one domain but easier to ascertain in the other domain. Similarly, a random signal as illustrated in FIG. 2A has a frequency domain spectrum as shown in FIG. 2B which is characterized by a number of randomly positioned peaks.

However, the power density or frequency domain plot of a wave may have a suggested periodicity although no real periodic structure exists. This is illustrated in FIGS. 3A and 3B which are the time and frequency domain plots of a random signal with a short high amplitude burst added to the signal. The frequency domain plot thereof in FIG. 3B indicates a suggested periodicity similar to that of the periodic signal in FIG. 1B which is misleading. In this case, the high amplitude burst has the effect of reducing the spectral resolution in the frequency domain. The effect of "smoothing" the spectrum is to give the appearance of periodicity. In both the periodic example and the burst example the phase information of the signal is lost in the transformation to the power spectrum domain. Hence, a real periodic wave structure will manifest itself as phase structure as well as in the periodic amplitude structure in the power spectrum domain. However, the converse is not necessarily true. Accordingly, some periodicity in the power density spectrum is not a sufficient condition to guarantee phase coherence in the time domain.

A further example of this concept is illustrated in FIGS. 4A and 4B which are the time domain and frequency domain plots for an impulse signal, and in FIGS. 5A and 5B which are the time and frequency domain plots of white noise. The two signals are obviously quite different in the time domain, as seen in FIGS. 4A and 5A, but the power density spectrum or frequency domain plots of the two signals are strikingly similar. The important difference, which is eliminated from the frequency domain plot, is that the impulse has phase coherences such that at some point in time all of the signals come together to form the impulses and then cancel each other at all other times. White noise simply has a random phase pattern.

In accordance with the present invention phase coherence of a signal is detected as a means of ascertaining whether or not the signal has a periodic wave structure.

This is accomplished by obtaining a temporal histogram which is related to a frequency domain moment. In a preferred embodiment the temporal histogram is obtained by determining time periods between zero crossings of the signal. By generating an interval histogram of the zero crossing periods periodicity of the wave is readily ascertained. For example, periodic structure present in the temporal waveform will tend to produce uniformity in the zero crossing intervals. Conversely, a purely random time domain structure will have a random phase structure as indicated by the random time interval histogram. This is illustrated in FIGS. 6A and 6B which is a plot of a temporal periodic wave and the time intervals of zero crossings therein. The intervals between zero crossings in the periodic wave tend to fall in the time intervals 14 and 16 in FIG. 6B.

Conversely, FIG. 7A is a real time plot of a random signal, and the time interval histogram thereof illustrated in FIG. 7B shows that the time intervals between zero crossings do not show a dominant structure but rather the time intervals vary over a wide range. Thus, the uniformity of the zero crossing intervals of FIG. 6B are indicative of a periodic waveform, whereas the random time intervals illustrated in FIG. 7B are indicative of a random signal.

The determination of periodic wave structure by examining the periods between zero crossings of the wave is readily implemented. FIG. 8 is a functional block diagram of apparatus which is useful in determining the time intervals. A real time RF input signal is applied to a zero crossing detector 20 which detects the zero crossings of the RF signal. Such a zero crossing detector may comprise a Schmitt trigger monostable multivibrator which is commercially available, such as the TI 74221 dual Schmitt trigger monostable circuitry. The detector generates a pulse for a zero crossing of the signal, and the pulse is applied to an interval timer 22 as a reset signal. Thus, each time the RF input crosses zero a pulse from detector 20 resets the timer 22.

However, just prior to being reset to zero, the counter output is read. This indicated count then corresponds to one of a plurality of bin counters. At that instant, the specific bin counter corresponding to the indicated count is incremented. In this way, after many zero crossings have been detected, a record of the distribution of interval lengths (during the sample period) will be recorded as counts in each bin.

There has been described a method for determining periodicity in a wave structure generating a temporal histogram of a wave. The method is readily implemented. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of determining characteristics of biological tissue comprising the steps of transmitting an ultrasonic wave into said biological tissue, detecting ultrasonic waves reflected by said biological tissue, determining zero crossing points of the wave structure of the reflected ultrasonic waves, measuring time intervals between zero crossings, and analyzing said measured time intervals for uniformity.

2. The method as defined by claim 2 wherein said step of analyzing said measured time intervals includes developing a histogram of said measured time intervals.

3. Apparatus for use in determining characteristics of biological tissue by determining periodicity of a back scattered ultrasonic wave comprising a zero crossing detector for detecting zero crossings of a back scattered ultrasonic wave, means for applying a back scattered ultrasonic wave to said zero crossing detector, said zero crossing detector generating a signal indicative of each zero crossing, timing means, means for applying said signal from said zero crossing detector to said timing means, said timing means indicating the time interval between signals, and a multibin counter for counting time intervals.

4. Apparatus as defined in claim 3 wherein said zero crossing detector comprises a Schmitt triggered monostable multivibrator which generates a pulse in response to each zero crossing.

* * * * *

UNITED STATES PATENT AND TRADEMARK OFFICE
CERTIFICATE OF CORRECTION

PATENT NO. : 4,453,550
DATED : June 12, 1984
INVENTOR(S) : Stephen W. Flax

It is certified that error appears in the above—identified patent and that said Letters Patent is hereby corrected as shown below:

Col. 4, line 25, delete "2" and substitute therefor --1--;

Col. 4, line 42, delete "in" and substitute therefor --by--.

Signed and Sealed this

First Day of January 1985

[SEAL]

Attest:

GERALD J. MOSSINGHOFF

Attesting Officer

Commissioner of Patents and Trademarks